(12) United States Patent
Tang

(10) Patent No.: US 6,890,767 B2  
(45) Date of Patent: May 10, 2005

(54) METHOD TO REDUCE SWITCH THRESHOLD OF SOFT MAGNETIC FILMS

(75) Inventor: Denny D. Tang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/279,266

(22) Filed: Oct. 24, 2002

(65) Prior Publication Data

US 2004/0080977 A1 Apr. 29, 2004

(51) Int. Cl.$^7$ .............................................. H01L 21/00
(52) U.S. Cl. ........................... 438/3; 438/253; 438/396
(58) Field of Search ............................ 438/3, 238, 253, 438/381, 396

(56) References Cited

U.S. PATENT DOCUMENTS

| | | | |
|---|---|---|---|
| 5,946,228 A | 8/1999 | Abraham et al. ........... 365/173 |
| 6,072,718 A | 6/2000 | Abraham et al. ........... 365/173 |
| 6,104,633 A | 8/2000 | Abraham et al. ........... 365/171 |
| 6,256,223 B1 | 7/2001 | Sun ............................ 365/171 |
| 6,259,644 B1 | 7/2001 | Tran et al. .................. 365/209 |
| 6,365,286 B1 * | 4/2002 | Inomata et al. ............. 428/692 |
| 6,501,678 B1 * | 12/2002 | Lenssen et al. ............. 365/173 |
| 6,534,978 B1 * | 3/2003 | Treutler et al. ............. 324/252 |

* cited by examiner

Primary Examiner—David Nhu  
(74) Attorney, Agent, or Firm—Haynes and Boone, LLP

(57) ABSTRACT

In magnetic memories it is important to be able to switch the states of the memory elements using minimal power i.e. external fields of minimal intensity. This has been achieved by giving each memory element an easy axis whose direction parallels its minimum surface dimension. Then, when the magnetic state of the element is switched by rotating its direction of magnetization, said rotation is assisted, rather than being opposed, by the crystalline anisotropy. Consequently, relative to the prior art, a lower external field is required to switch the state of the element.

9 Claims, 1 Drawing Sheet

METHOD TO REDUCE SWITCH THRESHOLD OF SOFT MAGNETIC FILMS

CROSS-REFERENCE

This invention relates to U.S. Patent Application Ser. No. 10/255,482, filed Sep. 26, 2002, entitled, "Scalable High Performance MRAM Cell Arrays" (TSMC2002-00059) assigned to a common assignee.

FIELD OF THE INVENTION

The invention relates to the general field of magnetic devices with particular reference to magnetic memory cells.

BACKGROUND OF THE INVENTION

In MRAM (magnetic random access memory), a cell's magnetic state is switched (i.e. its direction of magnetization is rotated) by an external magnetic field. This field is generated by a current through a program line on a chip. It is desirable to lower the switching threshold of MRAM cells so that the write current, and thus the chip power, can be reduced. The free layer in an MRAM cell is typically a soft magnetic film having a rectangular or oval shape.

The direction of the magnetization, M, in a magnetic soft film is determined by the lowest energy state of the film. In the sub-micron geometry film, the shape anisotropy $H_d$ dominates over the crystalline anisotropy $H_K$. The direction of the $H_K$ is usually called the easy axis direction of the film. Its direction is set by a small magnet in the deposition chamber during film deposition. The direction of the film's magnetization M would normally parallel the largest dimension of the cell to minimize demagnetization effects arising from the shape anisotropy due to its dominance in small geometry film, rather than the direction of the crystalline anisotropy. This is illustrated in FIG. 1 where memory element 11 is a rectangle of length 12 and width 13. As a result the magnetization would parallel the direction of 12. Nonetheless, the direction of crystalline anisotropy, or the direction of the easy axis, still plays a role in the magnitude of the switching field of the cell. The present invention discloses a method and structure that lowers the requirements for the switch field of the soft film. It is applicable to the MRAM cells.

A routine search of the prior art was performed with the following references of interest being found:

In U.S. Pat. No. 6,104,633, Abraham et al. show a MRAM and discuss the easy axis of the free layer. Abraham et al. also show related MRAMs in U.S. Pat. No. 6,072,718 and in U.S. Pat. No. 5,946,228. U.S. Pat. No. 6,259,644B (Tran et al.) shows a MRAM with free and pinned layers in anti-parallel directions while Sun discusses switching thresholds in U.S. Pat. No. 6,256,223 B1.

SUMMARY OF THE INVENTION

It has been an object of at least one embodiment of the present invention to provide a magnetic memory element whose state may be switched using a lower field than is required to switch the state of a memory element of the prior art.

Another object of at least one embodiment of the present invention has been to provide a process for manufacturing said memory element.

Still another object of at least one embodiment of the present invention has been that said process not require substantive changes to the processes presently in use for the manufacture of magnetic memory elements.

These objects have been achieved by giving said magnetic memory element an easy axis that parallels the minimum surface dimension of the element. Then, when the magnetic state of the element is switched by rotating its direction of magnetization, said rotation is assisted, rather than being opposed, by the crystalline anisotropy. Consequently, relative to the prior art, a lower external field is required to switch the state of the element.

DESCRIPTION OF THE PREFERRED EMBODIMENTS

Figure 1:
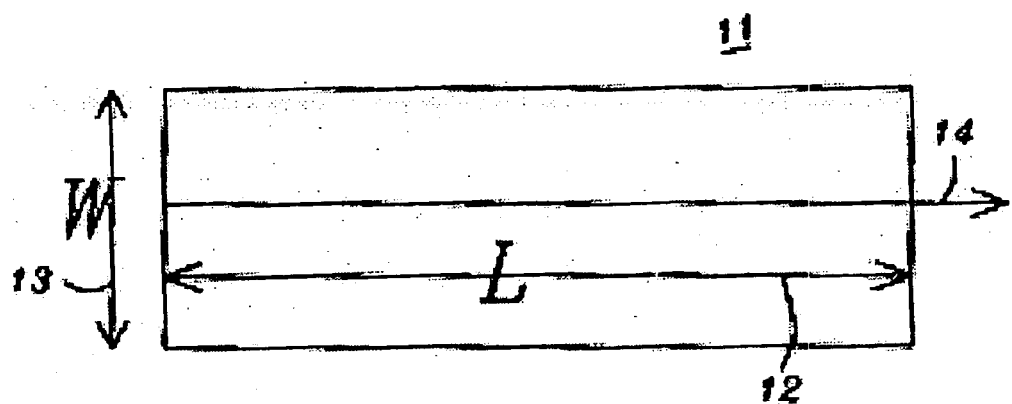
FIG. 1 shows a magnetic memory element of the prior art.
Figure 2:
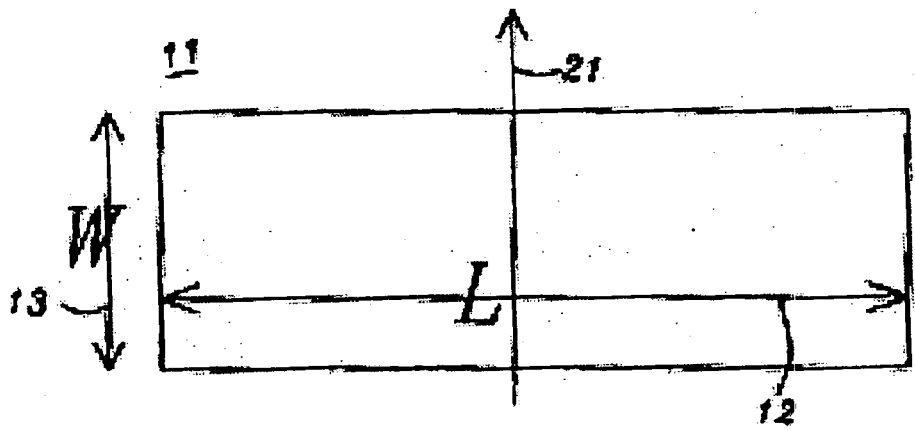
FIG. 2 illustrates the formation of an easy axis along a direction normal to the long direction of the film.

Shown in FIG. 2 is a schematic representation of the key feature of the present invention which is that, at the time the memory element 11 is formed, it is given an easy axis along direction 21 which is normal to the direction (14 in FIG. 1) of the long axis. Note that although we describe the invention in terms of elements having a rectangular shape, it will be understood that it can be applied to any element having at least two planar dimensions that are different, such as ovals, diamonds, and eyes.

Figure 3:
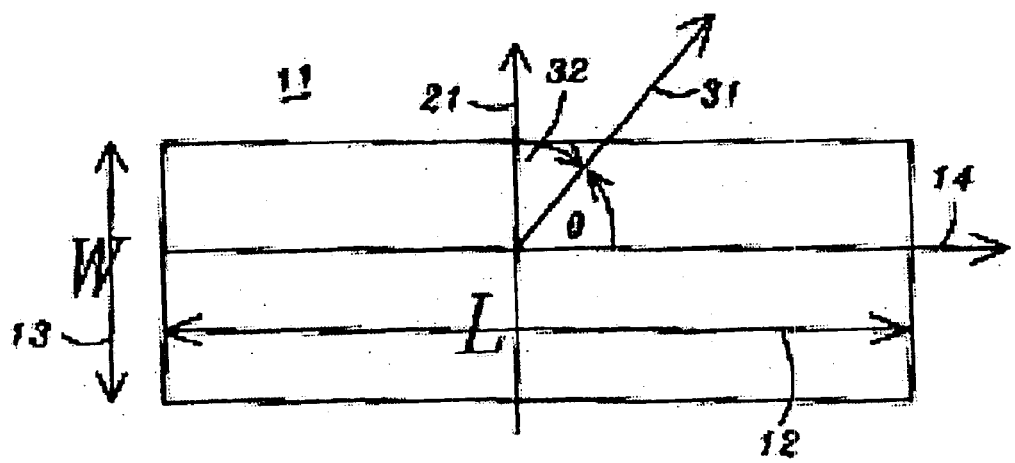
FIG. 3 illustrates the rotation of the magnetization when an external field is applied.

The significance of this change can be seen in the following analysis:

Referring now to FIG. 3, for the sake of reference, the x-axis runs horizontally (west-east) across the figure, along the direction 14 and the y-axis runs vertically (south-north) along the direction 21. We compute the angular change of the direction of magnetization 31 for a memory element of thickness t, magnetization M, when an external field $H_{ext}$ is applied parallel to the Y-axis:

(a) when the easy axis is in the Y direction 21 (present invention):

$$\tan\theta_y = (H_{ext} + H_K + Mt/L)/Mt/W)$$

(b) when the easy axis is in the X direction 14 (prior art):

$$\tan\theta_x = (H_{ext} + H_K + Mt/L)/Mt/W + H_K)$$

Since tan θy=tan θx it follows that, to achieve the same degree of rotation of the magnetization in a magnetic memory element, a lower Hext may be used if the easy axis is normal to the element's longest dimension instead of parallel to it.

In a cell array, to change the cell state, say from M pointing east to west, one would need to apply two external fields: one Hx (pointing west) and Hy (pointing north). The external magnetic field Hy will rotate the magnetization M to an angle away from the x-direction. The external field Hx will complete the switch.

Based on a uniform rotation model, the switching asteroid of a rectangular film can be described as $$Hx^{2/3} + Hy^{2/3} = Ho^{2/3}$$

and $$Ho = Mt^*(1/W - 1/L) + /- H_K$$

where the sign in front of $H_K$ is determined by the direction of the crystalline anisotropy. When $H_K$ (the easy axis) is along the long axis, positive sign applies, and when along the short axis, negative sign applies. Thus, the switching threshold is lower when $H_K$ is along the short axis.

We now describe a process for manufacturing the memory element described above. The process begins with the deposition of a layer 32 of a soft magnetic material (such as NiFe, CoFe, COFeB, or CoNiFe) on a substrate (to a thickness between about 5 and 50 Angstroms) and then patterning said layer to form a memory element 11 having a minimum dimension 13 and maximum dimension 12, as seen in FIG. 2. In the case where a multiple magnetic soft film stack is deposited, the direction of the easy axis of each layer can be made different by changing the direction of the magnet inside the deposition chamber.

In a second embodiment of the invention, memory element 11 is a stack made up of multiple layers of magnetically soft material separated layers of a non-magnetic material such as Cu, Ru, Pt, Ag, or Au, to a thickness between about 5 and 30 Angstroms.

The advantages of using a stack of several magnetic layers is that the total volume of the soft magnetic material increases and the thermal stability of the memory cell improves. By having the magnetization M in the soft magnetic material in the stack arranged in the anti-parallel direction, the net moment is lowered, which translates to lower switching threshold.

What is claimed is:

1. A process for manufacturing a magnetic memory element, comprising:
   (a) depositing on a substrate a first layer of a soft magnetic material having a first easy axis direction;
   (b) depositing a layer of a non-magnetic material on said first layer of soft magnetic material;
   (c) on said layer of non-magnetic material, depositing a second layer of soft magnetic material whose easy axis direction is permitted to be different from said first easy axis direction;
   (d) repeating steps (b) and (c) one or more times, thereby forming a stack; and
   (e) patterning said stack to form a memory element having minimum and maximum dimensions along said substrate and an easy axis parallel to said minimum dimension;
   whereby the memory element has a reduced switching threshold as compared to a memory element having an easy axis parallel to said maximum dimension.

2. The process described in claim 1, wherein said soft magnetic materials are NiFe, CoFe, CoNiFe, or COFeB.

3. The process described in claim 1, wherein said non-magnetic material is Cu, Ru, Pt, Au, or Ag.

4. The process described in claim 1, wherein each of said layers of soft magnetic material is deposited to a thickness between about 5 and 50 Angstroms.

5. The process described in claim 1, wherein each of said layers of non-magnetic material is deposited to a thickness between about 5 and 30 Angstroms.

6. The process described in claim 1, wherein said magnetic memory element has a shape that is a rectangle, an oval, a diamond, or an eye.

7. A process for creating an electrical device, comprising:
   providing a substrate;
   depositing a layer of a magnetic material on the substrate;
   patterning said layer to form a memory element, the memory element having a longer dimension and a shorter dimension; and
   applying a magnetic field Hext across the memory element to create a memory element having a comparatively small switching threshold by forming an easy axis parallel with the shorter dimension.

8. The process of claim 7 further comprising:
   repeating the steps of depositing, patterning, and applying to form a memory cell array.

9. The process of claim 7 wherein the magnetic field Hext is applied parallel to an axis (y) parallel to the shorter dimension to satisfy the equation:

$$\tan \theta_y = (H_{ext} + H_K + Mt/L)/Mt/W$$

where $H_K$ represents a crystalline anisotropy of the magnetic material;

Mt represents a magnetization of the magnetic material; and

L and W represent the longer and shorter dimensions, respectively.

* * * * *